United States Patent [19]

Yamazaki

[11] Patent Number: 5,013,579
[45] Date of Patent: May 7, 1991

[54] MICROWAVE ENHANCED CVD METHOD FOR COATING MECHANICAL PARTS FOR IMPROVED WEAR RESISTANCE

[75] Inventor: Shunpei Yamazaki, Tokyo, Japan

[73] Assignee: Semiconductor Energy Laboratory Co., Ltd., Kanagawa, Japan

[21] Appl. No.: 414,593

[22] Filed: Sep. 26, 1989

Related U.S. Application Data

[63] Continuation of Ser. No. 154,286, Feb. 10, 1988, abandoned.

[30] Foreign Application Priority Data

Feb. 10, 1987 [JP] Japan .................. 62-28956

[51] Int. Cl.$^5$ .................. B05D 5/12; C23C 16/26; C23C 16/50
[52] U.S. Cl. .................. 427/38; 427/45.1; 427/47; 427/249; 427/255.2
[58] Field of Search .................. 427/35, 38, 45.1, 47, 427/122, 249, 255.2

[56] References Cited

U.S. PATENT DOCUMENTS

| | | | |
|---|---|---|---|
| 2,344,906 | 3/1944 | Swanson | 427/249 |
| 2,392,682 | 1/1946 | Marek | 427/249 |
| 2,721,154 | 10/1955 | Hopf et al. | 427/122 |
| 2,758,948 | 8/1956 | Simon | 427/122 |
| 4,060,660 | 11/1977 | Carlson | 427/122 |
| 4,104,441 | 8/1978 | Fedoseev et al. | 427/249 |
| 4,401,054 | 8/1983 | Matsuo et al. | 427/47 |
| 4,434,188 | 2/1984 | Kamo et al. | 427/122 |
| 4,504,519 | 3/1985 | Zelez | 427/122 |
| 4,582,727 | 4/1986 | Neelameggham et al. | 427/228 |
| 4,634,605 | 1/1987 | Wiesmann | 427/249 |
| 4,645,713 | 2/1987 | Shioya et al. | 427/122 |
| 4,701,317 | 10/1987 | Arakawa et al. | 427/249 |
| 4,707,384 | 11/1987 | Schachner et al. | 427/249 |
| 4,724,159 | 2/1988 | Yamazaki | 427/255.2 |
| 4,755,399 | 7/1988 | Fujii et al. | 427/284 |
| 4,758,280 | 7/1988 | Bergmann et al. | 427/38 |

FOREIGN PATENT DOCUMENTS

61-158898 7/1986 Japan .

OTHER PUBLICATIONS

Kawanada et al, "Large Area Chemical Vapor Deposition of Diamond Particles and Films Using Magneto-Microwave Plasma", Japanese Journal of Applied Physics, vol. 26, No. 6, Jun. 1987, pp. LL 1032–1034.

Primary Examiner—Norman Morgenstern
Assistant Examiner—Margaret Bueker
Attorney, Agent, or Firm—Sixbey, Friedman, Leedom & Ferguson

[57] ABSTRACT

A cyclotron resonance chemical vapor deposition method for coating mechanical component parts, in which the method is particularly advantageous in coating for parts having substantially flat surfaces and corners which are subject to wear. The method includes disposing the parts in a reaction chamber, inputting a reactive gas into the reaction chamber and exciting the reactive gas in the reaction chamber by applying microwave electromagnetic energy in the presence of a magnetic field. A layer is deposited on the corners and flat surfaces of the parts by chemical vapor reaction such that the layer at the corners is thicker than that on the flat surfaces due to the concentration of the electric field at the corners, thus providing more wear resistance at the corners.

13 Claims, 4 Drawing Sheets

MICROWAVE ENHANCED CVD METHOD FOR COATING MECHANICAL PARTS FOR IMPROVED WEAR RESISTANCE

This application is a continuation-in-part of Ser. No. 154,286, filed Feb. 10, 1988, now abandoned.

BACKGROUND OF THE INVENTION

This invention relates to a microwave enhanced CVD method for forming a carbon film and its products.

Recently, ECR CVD has attracted the interests of researchers as a new method of manufacturing thin films, particularly amorphous thin films. For example, Matsuo et al discloses one type of such an ECR CVD apparatus in U.S. Pat. No. 4,401,054. This recent technique utilizes microwaves to energize a reactive gas into a plasma state by virtue of a magnetic field which functions to pinch the plasma gas within the excitation space. With this configuration, the reactive gas can absorb the energy of the microwaves. A substrate to be coated is located distant from the excitation space (resonating space) for preventing the same from being spattered. The energized gas is showered on the substrate from the resonating space. In order to establish an electron cyclotron resonance, the pressure in a resonating space is kept at $1 \times 10^{-3}$ to $1 \times 10^{-5}$ Torr at which electrons can be considered as independent particles and resonate with a microwave in an electron cyclotron resonance on a certain surface on which the magnetic field takes a particular strength required for ECR. The excited plasma is extrated from the resonating space, by means of a divergent magnetic field, to a deposition space which is located distant from the resonating space and in which is disposed a substrate to be coated.

In such a prior art method, it is very difficult to form a thin film of a polycrystalline or single-crystalline structure, so that currently available methods are almost limited to processes for manufacturing amourphous films which have lower hardness. Also, high energy chemical vapor reaction is difficult to take place in accordance with such a prior art and therefore a diamond film or other carbon films having high melting points, or uniform films on uneven surface, such as exteriors of the parts of watchs, which have depressions and caves can not be formed.

SUMMARY OF THE INVENTION

It is therefore an object of the invention to realize a light, beautiful and weariless watch.

The carbon coating is implemented for several purposes. When the parts of gears or screws as mechanical parts for or parts used for motion transfer in watches are coated, the carbon coating function to reinforce the strength of the parts and endow the parts with the resistance to abrasion. On the other hand, when the exterior of watches are coated, the carbon coatings become decorations.

According to one aspect of the invention, in addition to a carbon compound, nitrogen and/or a nitrogen compound gas is inputted to the reaction chamber. The inputted nitrogen functions to prevent lattice defects from growing by virtue of external or internal stress. When a boron compound is also inputted together with the nitrogen compound, the adhesivity of carbon deposited is improved. Boron nitride appears to be the binder between the carbon and the underlying substrate to be coated such as parts of watch. Preferably, carbon and boron nitride are deposited on the substrate in the form of crystalline grain particles or a layer containing nitrogen and boron at less than 10%.

According to another aspect of the invention, a new CVD process has been culminated. The new process utilizes a mixed cyclotron resonance which was introduced firstly by the inventors. In the new type of exciting process, a sonic action of reactive gas itself must be taken into consideration as a non-negligible perturbation besides the interaction between respective particles of the reactive gas and magnetic field and microwave, and therefore charged particles of a reactive gas can be absorbed in a relatively wide resonating space. Preferably, the pressure is maintained higher than 3 Torr. For the mixed resonance, the pressure in a reaction chamber is elevated $10^2$–$10^5$ times as high as that of prior art. For example, the mixed renonance can be established by increasing the pressure after ECR takes place at a low pressure. Namely, first a plasma gas is placed in ECR condition at $1 \times 10^{-3}$ to $1 \times 10^{-5}$ Torr by inputting microwave under the existence of magnetic field. Then a reactive gas is inputted into the plasma gas so that the pressure is elevated to 0.1 to 300 Torr and the resonance is changed from ECR to MCR (Mixed Cyclotron Resonance). The MCR is a new type of resonance utilizing the whistler mode. Carbon can be decomposed and undergo a necessary reaction at only such a comparatively high pressure. In process, diamond is likely to grow selectively on convexies.

Although carbon is deposited also in an amorphous phase when diamond is prefered, hydrogen in a plasma state eliminates preferentially amorphous carbon by etching, remaining crystalline carbon.

It has been found that the hardness of the diamond formed by the present invention is 1.3 to 3.0 times as high as that of diamond which has been made by prior art vapor phase method. In what follow, the term, "film," is used in a broad meaning. If a number of diamond particles are finely distributed on a furface, we call such a diamond coating as a "film." Of course, a uniform and continuous amorphous layer is called a "film."

When a number of plastic gear-wheels are coated with diamond film, e.g., 1–10 micron thick in accordance with the present invention, a new kind of gearwheel is obtained which is characterized by a light weight, a high wear resistance, a smooth surface and a low price.

When the parts of a wrist watch are coated with carbon film, such parts can be made of plastics and alminium or its alloy having attractive processability so that the wrist watch is strongly formed and light weighted. Especially, electric field tends to be concentrated at the corners of the parts, and therefore such corners particularly exposed to external impacts can be coated with a thicker carbon film by a factor of two in comparison with flat surfaces.

DETAILED DESCRIPTION OF THE PREFERRED EMBODIMENTS

Figure 1:
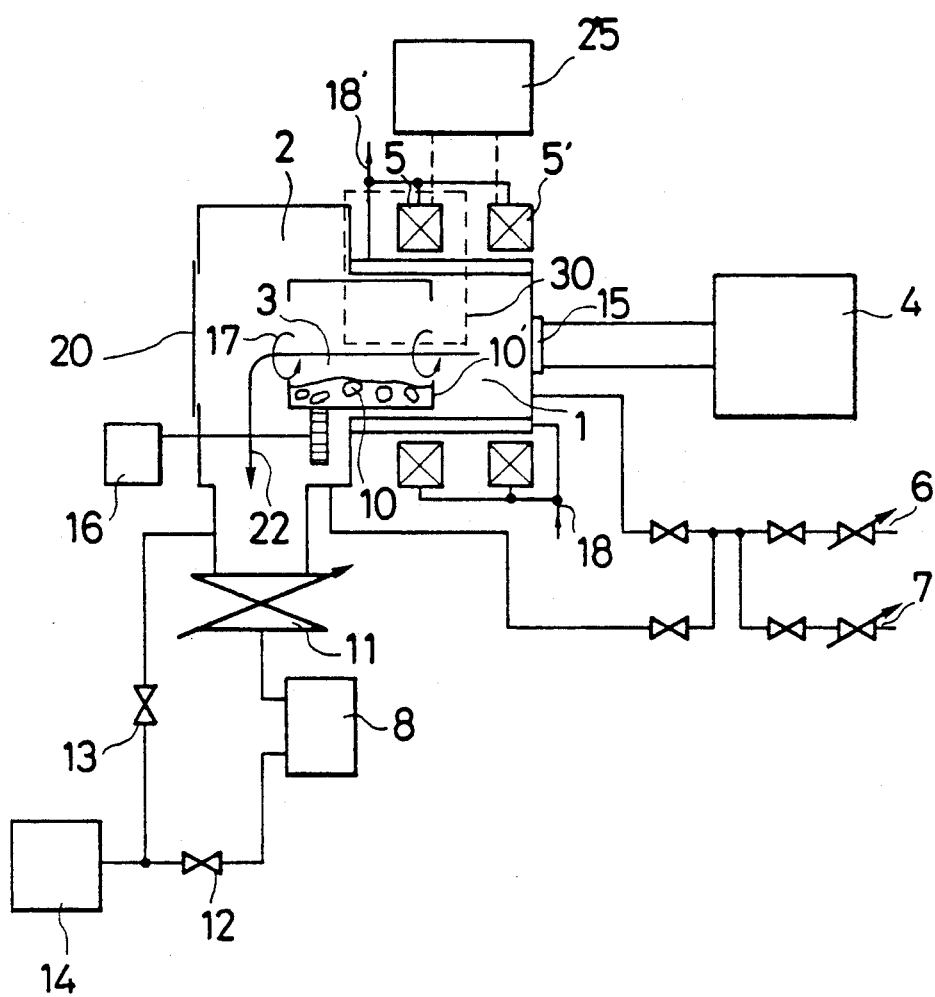
FIG. 1 is a cross section view showing a CVD apparatus in accordance with the present invention.

Referring to FIG. 1, an embodiment of the invention is illustrated. In the figure, the apparatus comprises a reaction chamber in which a plasma generating space 1 and an auxiliary space 2 are defined and which can be held at an appropriate pressure, a microwave genarator 4, electro-magnets 5 and 5' which are supplied with an electric power from a power supply 25, and a water cooling system 18. The plasma generating space 1 has a circular cross section. In the plasma generating space 1, a hollow cylinder 10' having inward-turned brims is rotatably supported in the space so that a microwave emitted from the microwave genarator 4 passes through the cylinder along its axis. The cylinder 10' is made of a stainless steel or a quartz and turned by means of a motor 16 through a gear. Provided for evacuating the reaction chamber is a evacuating system comprising a turbo molecular pump 8 and a rotary pump 14 which are connected with the reaction chamber through pressure controlling valves 11, 12 and 13. The process with this appratus is carried out as follow.

Objects 10 to be coated with carbon film are parts of watches such as frames made of aluminium alloys or plastics, windows made of glasses or plastics, or timing mechanism parts such as gearwheels with 3-10 mm in diameter and 0.2-2.0 mm in thickness. The objects 10 are put in the cylinder 10' and turned at 0.1-10 rpm during process. At the same time, the objects 10 are heated to a certain elevated temperature at which the objects are not damaged. For plastic objects, the elevated temperature is, e.g., 150°-300° C.; for aluminium or its alloy objects, e.g., 400°-700° C.; for iron, stainless steel or other metallic objects, e.g., 700°-1000° C. As the temperature elevates, the hardness of the coating becomes high and the proportion of diamond increases. The cylinder 10', although the means is not illustrated in the figure, is shaken by micro-vibration of 100 Hz-10 KHz. By the turning and the vibration, the surfaces of the objects exposed to the reactive gas are always switching during process. The reaction chamber is evacuated by the turbo molecular pump 8 and the rotary pump to $1 \times 10^{-6}$ Torr or lower. Then, argon, helium or hydrogen as a non-productive gas is introduced to the reaction chamber from a gas introducing system 6 at 30 SCCM, and a microwave of 2.45 GHz is emitted from the microwave generator at 500 W through a microwave introduction window 15 to the plasma generating space 1 which is subjected to an magnetic field of about 2 K Gauss induced by the magnets 5 and 5'. The pressure of the non-productive gas is $1 \times 10^{-4}$ Torr. A plasma is generated in the space 1 at a high density by the energy of the microwave. The surfaces of the objects 10 is cleaned by high energy elecrons and non-productive atoms. In addition to the introduction of non-productive gas, $C_2H_2$, $C_2H_4$ and/or $CH_4$ are introduced at 200 SCCM through a introduction system 7. At the same time, a large amount of hydrogen is introduced into the reaction chamber so that the carbon compound gas is diluted with the hydrogen to 0.1-2.0%. The pressure of the reaction chamber is maintanined at 0.1-300 Torr, preferably 3-30 Torr, e.g., 10 Torr. By virtue of the comparatively high pressure, the product can be deposited at a high speed and spread over widely in the chamber. The reactive gas is excited by the energy of microwave in the same manner as carried out with the nonproductive gas explained in the foregoing description. As a result of a mixed resonance, carbon is deposited in the form of a diamond film or an i-carbon (insulated carbon consisting of crystalline particles) film on the objects 10.

Figure 2A:
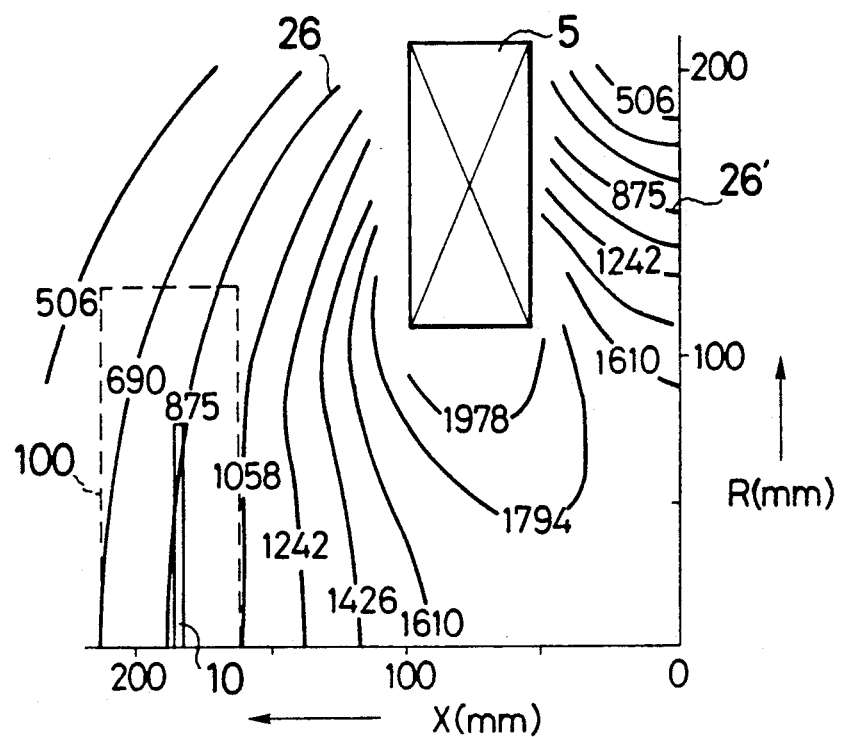
FIG. 2(A) is a graphical diagram showing the plofile of the equipotential surfaces of magnetic field in cross section in accordance with a computor simulation.
Figure 2B:
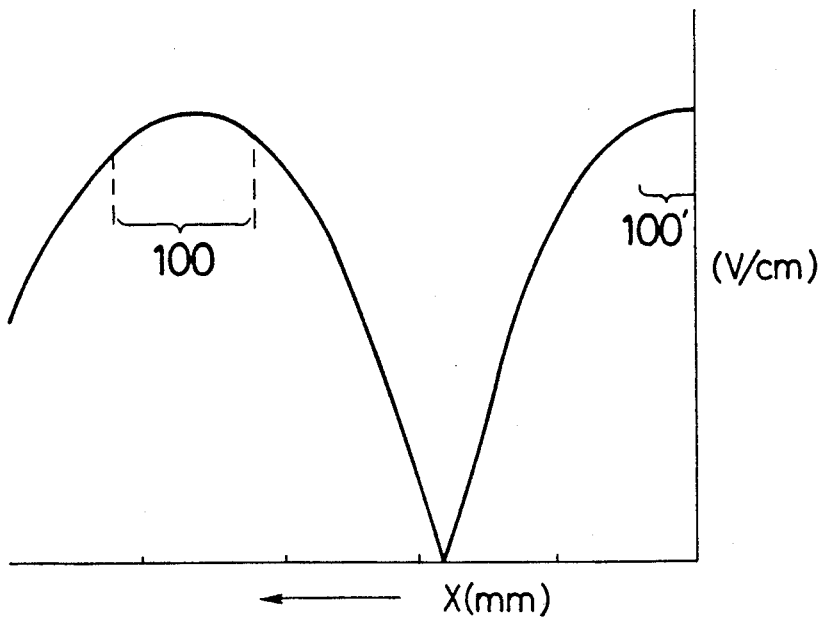
FIG. 2(B) is a graphical diagram showing the strength of electric field in accordance with a computor simulation.
Figure 3A:
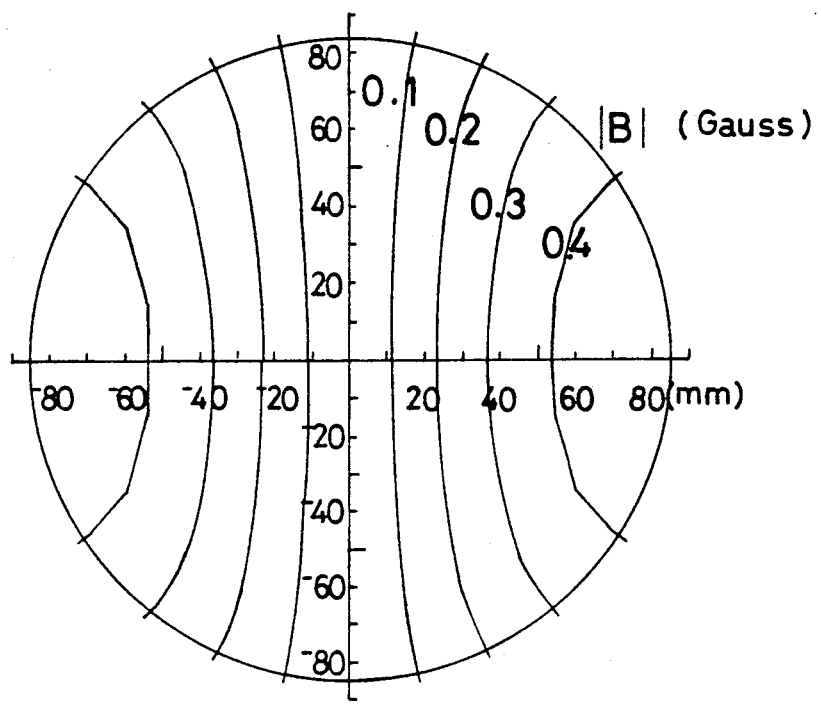
FIGS. 3(A) and 3(B) are graphical diagrams showing equipotential surfaces in terms of magnetic field and electric field of microwave propagating in a resonating space respectively.
Figure 3B:
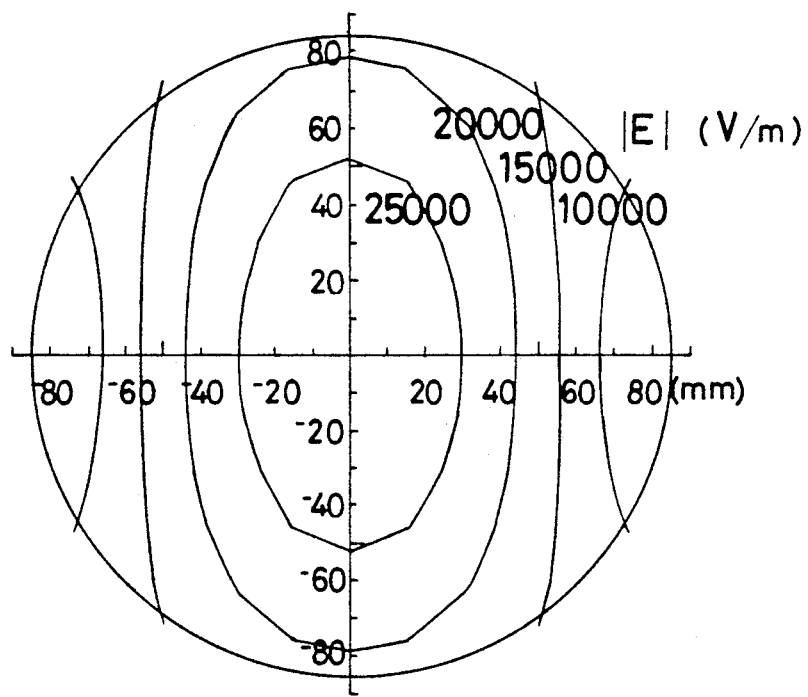

FIG. 2(A) is a graphical diagram showing the distribution of magnetic field on the region 30 in FIG. 1. Curves on the diagram are plotted along equipotential surfaces and given numerals indicating the strengths on the respective curves of the magnetic field induced by the magnets 5 and 5' having a power of 2000 Gauss. By adjusting the power of the magnets 5 and 5', the strength of the magnetic field can be controlled so that the magnetic field becomes largely uniform over the surface to be coated which is located in the region 100 where the magnetic field ($875 \pm 185$ Gauss) and the electric field interact. In the diagram, a reference 26 designates the equipotential surface of 875 Gauss at which ECR (electron cyclotron resonance) condition between the magnetic field and the frequency of the microwave is sutisfied. Of course, in accordance with the present invention, ECR can not be established due to the high pressure in the reaction chamber, but instead a mixed cyclotron resonance (MCR) takes place in a broad region including the equipotential surface of the ECR condition. FIG. 2(B) is a graphical diagram of which the X-axis corresponds to that of FIG. 2(A) and shows the strength of electric field of the microwave in the plasma generating space 1. The strength of the electric field takes its maximum value in the regions 100 and 100'. However, in the region 100', it is difficult to heat the substrate 10' without disturbing the propagation of the microwave. In other region a film is not uniformly deposited, but deposited the product in the form of a doughnut. It is for this reason that the substrate 10 is disposed in the region 100. The plasma flows in the lateral direction. According to the experimental, a uniform film can be formed on a circular substrate having a diameter of up to 100 mm. Preferably, a film is formed in the chamber on a circular substrate having a diameter of up to 50 mm with a uniform thickness and a uniform quality. When a larger substrate is desired to be coated, the diameter of the space 1 can be sized double with respect to the vertical direction of FIG. 2(A) by making use of 1.225 GHz as the frequency of the microwave. FIGS. 3(A) and 3(B) are graphical diagrams showing the distributions of the magnetic field and the electric field due to microwave emitted from the microwave generator 4 on a cross section of the plasma generating space 1. The curves in the circles of the figures are plotted along equipotential surfaces and given numerals showing the strength. As shown in FIG. 3(B), the electric field reaches its maxmum value at 25 KV/m.

The diffraction images of films formed in accordance with the present invention were obtained. As results, halo patterns were obserbed together with spots indicating the existence of diamond. When the film was deposited at a substrate temperature as low as 350° C., a halo pattern which is peculier to amorphous structure was observed. On the other hand, clear spots indicating the existence of diamond appeared on the deffraction pattern of the film deposited at a substrate temperature 800° C. or higher. When the film was deposited at an intermediate temperature, the carbon film became i-carbon film which is the mixture of amorphous carbon and micro-crystalline carbon. Further, the films were doposited at 150°-350° C. by virtue of different input powers. When the power of microwave inputted was 1.0 KW, a halo pattern and spots due to the existence of diamond were simultaneously observed indicating an i-carbon structure. The halo patterns gradually disappeared as the microwave power elevates, and when the power reaches a high level not lower than 1.5 KW the film became rich in diamond structure. In this experimental, the carbon films contain hydrogen at 1-30 at %. Still further, the films were deposited at 700° C. by virtue of different input powers. As the microwave power elevated from 500 W, the halo pattern gradually disappeared, and when the power reached 700 W or higher, diamond structure prevailed in the film.

The pressure in the reaction chamber is chosen at that required for ECR condition, so that a preliminary plasma discharge takes place. While the discharge continues, the pressure is changed to 1 Torr to $3 \times 10^3$ Torr where a mixed resonance takes place with a plasma of which particles have a mean free path of 0.05 mm to several milimeters, normally not more than 1 mm.

Next, another deposition method in accordance with the present invention will be described. The deposition apparatus used for the preceding embodiment can be used also for this embodiment.

A number of objects 10 such as plastic gear wheels are placed in the cylinder 10', and the reaction chamber is evacuated to $1 \times 10^{-6}$ Torr or a higher vacuum condition. Then, hydrogen gas is introduced from a gas introducing system 6 at 30 SCCM, and a microwave of 500 Watt at 2.45 GHz is emitted from the microwave generator 4 thorugh a microwave introduction window 15 to the plasma generating space 1 which is subjected to an magnetic field of about 2 K Gauss induced by the magnets 5 and 5'. The hydrogen is excited into a high density plasma state in the space 1 at $1 \times 10^{-4}$ Torr by the energy of the microwave. The surfaces of the objects 10 are cleaned by high energy elecrons and hydrogen atoms. In addition to the introduction of the hydrogen gas, a carbon compound gas as the productive gas such as $C_2H_2$, $C_2H_4$, $CH_3OH$, $C_2H_5OH$ or $CH_4$ are inputted at 30 SCCM through an introduction system 7. In this process, the productive gas is diluted with hydrogen at a sufficiently thin density, e.g., 0.1 to 5%. Further in addition to this, a nitrogen or its compound gas, such as ammonia or nitrogen gas, is inputted to the reation chamber from the introduction system. The proportion of the nitrogen compound gas to the carbon compound gas is 0.1%-5%. Then, the pressure in the reaction chamber is maintained at 0.1 Torr-300 Torr, preferably 3-30 Torr, e.g., 1 Torr. By increasing this pressure in the reaction chamber, it is possible to make high the density of the productive gas and, therefore, faster the growth rate of the product. Namely, carbon atoms are excited in a high energy condition so that the objects 10 disposed in the cylinder 10' is coated with carbon in the form of a film made of i-carbon or diamond having 0.1 to 100 microns in grain diameter. The deposited carbon contains nitrogen at 0.01-1 weight %.

Next, a further embodiment will be described. Objects 10 are disposed in the cylinder 10', and the reaction chamber is evacuated to $1 \times 10^{-6}$ Torr or a higher vacuum condition. Then, hydrogen gas is introduced from a gas introducing system 6 at 300 SCCM, and a microwave of 1 Kilo Watt at 2.45 GHz is emitted from the microwave generator 4 thorugh a microwave introduction window 15 to the plasma generating space 1 which is subjected to an magnetic field of about 2 K Gauss induced by the magnets 5 and 5'. The hydrogen is excited into a high density plasma state in the space 1 by the energy of the microwave. The surfaces of the objects 10 are cleaned by high energy elecrons and hydrogen atoms. In addition to the introduction of the hydrogen gas, a carbon compound gas as the productive gas such as $C_2H_2$, $C_2H_4$, $CH_3OH$, $C_2H_5OH$ or $CH_4$ are inputted at 3 SCCM through an introduction system 7. In this process, the productive gas is diluted with hydrogen at a sufficiently thin density, e.g., 0.1 to 15%. Further in addition to this, a nitrogen compound gas such as ammonia, $NO_2$, $NO$, $N_2$ or nitrogen gas, and $B_2H_6$ or $BF_3$ are inputted to the reation chamber from the introduction systems 7 and 8 respectively at B/N=1. The proportion of $B_2H_6(BF_3)+NH_3$ to the carbon compound gas is 1%-50%. Then, the pressure in the reaction chamber is maintained at 1 Torr-760 Torr, preferably higher than 10 Torr or 10-100 Torr, e.g., 30 Torr. By increasing this pressure in the reaction chamber, it is possible to make high the density of the productive gas and, therefore, faster the growth rate of the product. Namely, the objects 10 disposed in the cylinder 10' are coated with carbon containing nitrogen and boron (or in the form of boron nitride). The product includes carbon and boron nitride as the main components, the sum of whose proportions is at least 90%.

On the electron beam diffraction image of the thin film produced in accordance with the above procedure, observed are spots indicating the presence of polycrystalline boron nitride and crystal carbon, i.e., diamond (single-crystalline particles). Namely, the film is made of the mixture of boron nitride and diamond. As the microwave power is increased from 1 KW to 5 KW, the proportion of diamond in the film increases.

When $BF_3$ and/or $NF_3$ is used as the boron and/or nitrogen source. the plasma gas becomes containing fluorine and which fluorine functions to eliminate impurity residing on the surface to be coated by etching.

For reference, a film formation process was performed in the same manner as in the above but without using a magnetic field. As a result, a graphite film was deposited.

By a similar process, amorphous or microcrystalline film can also be deposited by appropriately selecting the deposition condition. An amorphous film is deposited when carbon compound gas is diluted with the larger amount of hydrogen gas, when the input power is comparatively small and when the process temperature is comparatively low.

It is a significant feature of the invention that the carbon formed in accordance with the invention has a very high hardness irrespective of whether the carbon is amorphous or crystalline. The Vickers hardness is 4500-6400 Kg/mm², e.g., 2000 Kg/mm². The thermal conductivity is not lower than 2.5 W/cm deg, e.g., 5.0-6.6 W/cm deg.

Figure 4:
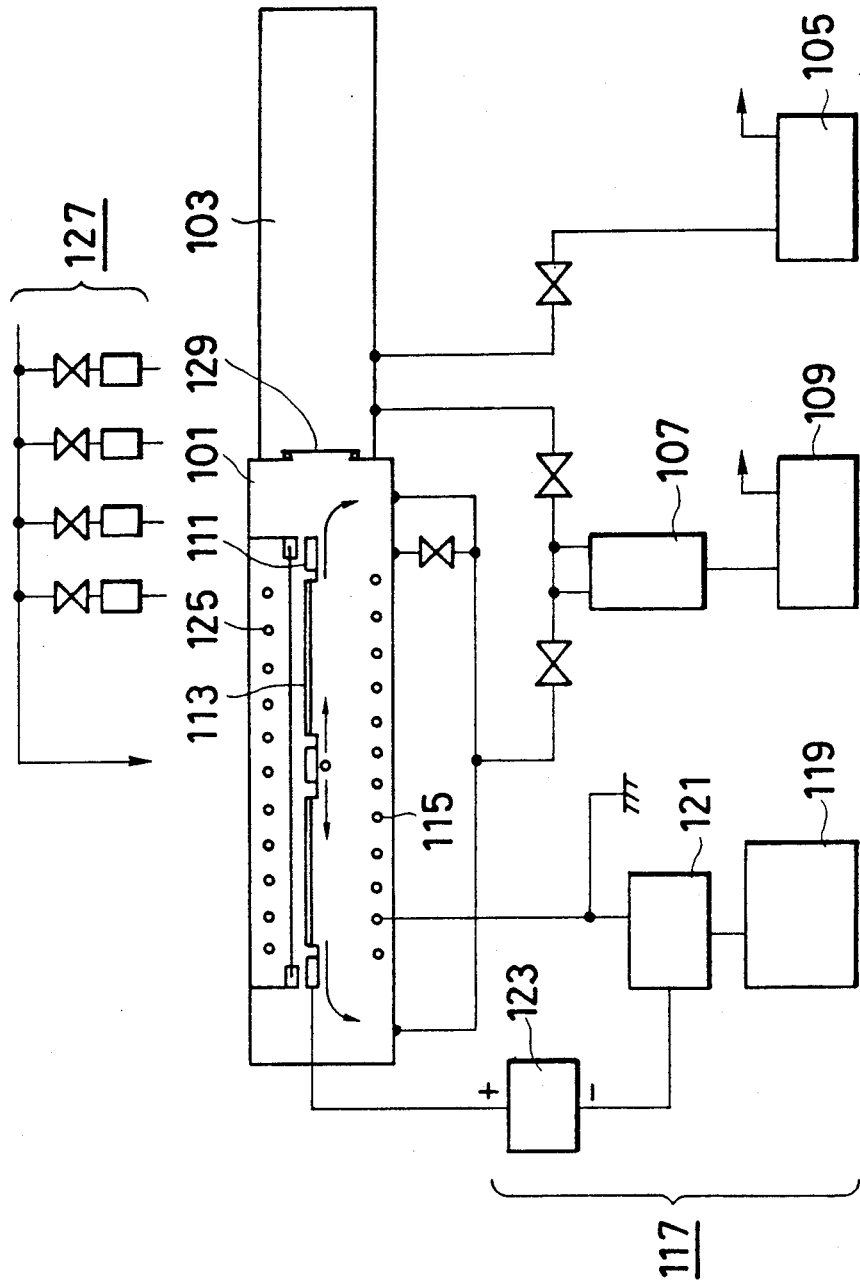
FIG. 4 is a cross sectional view showing another CVD apparatus for depositing a carbon layer in accordance with the present invention.

The present invention can be applied for the formation of carbon by means of glow or arc discharge enhanced CVD caused by an r.f. power. FIG. 4 is a cross sectional view showing a CVD apparatus for deposition by virtue of an r.f. power. In the figure, the apparatus comprises a reaction chamber 101. a loading chamber 103, a rotary pump 105 for evacuating the loading chamber 103, a turbo molecular pump 107 associated with a rotary pump 109 for evacuating both the reaction chamber 101 and the loading chamber 103, a gas feeding system 127 for inputting process gas such as reactive gas or dopant gas through a nozzle 129, a substrate holder 111 for supporting objects 113, electrodes 115 disposed opposite to the holder 111, an RF power supply 117 consisting of a radiofrequency power source 119 associated with a matching circuit 121 and a DC bias circuit 123 for supply an r.f. power between the electrodes 115 and the substrate holder 111, and a halogen lamp heater 125 with a quartz window 129 for heating the objects 113. The deposition process for coating the objects 113 with a carbon film is as follow.

After disposing the objects 113 in the reaction chamber 101 through a gate 129, a reactive gas composed of a gaseous carbon compound such as $CH_4$, $C_2H_4$ and $C_2H_2$, and a dopant gas such as nitrogen, a nitrogen compound gas and a boron compound gas if necessary were inputted to the reaction chamber at $1\times10^{-3}$ to $5\times10^{-1}$ Torr. The carbon compound gas was diluted with hydrogen at 50 mol %. At the same time, the objects 113 were heated to not higher than 450° C. by means of the heater 125. In this condition, a vapor reaction was initiated by means of r.f. power inputted from the power supply 117. The r.f. power was 50 W to 1 KW (0.03 to 3.00 W/cm$^2$) at 13.56 MHz superimposed on an DC bias voltage of $-200$ V to $+400$ V. Then, carbon films were deposited on the objects 113 at a growth rate of 150 Å/min. The carbon film looked like an amorphous structure rather than a crystalline structure. Despite the amorphous structure, the hardness was measured as high as that of a diamond film. The Vickers hardness thereof was 4500-6400 Kg/mm$^2$, e.g., 2000 Kg/mm$^2$. So we call it "diamond-like carbon" or DLC for short.

In accordance with the present invention, a super lattice structure can be also formed. A boron nitride (BN) thin film is deposited in the same way as illustrated in the above but without using carbon compound gas. A carbon thin film and a BN thin film are deposited in turn many times so that a super lattice structure is stacked on a substrate.

The invention should not limited to the above particular embodiments and many modifications and variations may cause to those skilled in the art. For example, it has been proved effective to add aluminium or phosphorus into carbon at 0.001 to 1 weight %.

I claim:

1. A cyclotron resonance chemical vapor deposition method for coating mechanical component parts, said parts having (a) flat surfaces and (b) corners subject to wear, said method comprising the steps of:
    disposing said parts in a reaction chamber;
    inputting into said reaction chamber a reactive gas comprising (a) carbon and optionally (i) nitrogen or (ii) nitrogen and boron or (b) boron and nitrogen;
    exciting said reactive gas in said reaction chamber by applying microwave electromagnetic energy in the presence of a magnetic field in the pressure range of 0.01-300 Torr to cause cyclotron resonance in the reaction chamber where the electric field of said electromagnetic energy tends to concentrate at said corners of the parts; and
    depositing a layer on the corners and flat surfaces of said parts by chemical vapor reaction such that the layer at the corners is thicker than that on the flat surfaces due to the concentration of the electric field at the corners to thus render the corners more resistant to said wear.

2. A method as in claim 1 where the thickness of the layer at the corners is approximately twice that of the layers at the flat surfaces.

3. A method as in claim 1 where said reactive gas comprises at least carbon and said layer comprises diamond or diamond like carbon.

4. A method as in claim 3 where said reactive gas includes an alcohol.

5. A method as in claim 1 where said reactive gas comprises boron and nitrogen and said layer comprises boron nitride.

6. A method as in claim 1 where said parts are parts of a watch.

7. A method as in claim 1 where said cyclotron resonance is mixed cyclotron resonance.

8. A method for coating mechanical component parts, said parts having (a) flat surfaces and (b) corners subject to wear, said method comprising the steps of:
    disposing said parts in a reaction chamber;
    inputting into said reaction chamber a reactive gas comprising (a) carbon and optionally (i) nitrogen or (ii) nitrogen and boron or (b) boron and nitrogen;
    exciting said reactive gas in said reaction chamber by applying a DC biased, RF electric field such that said electric field tends to concentrate at said corners of the parts; and
    depositing a layer on the corners and flat surfaces of said parts by chemical vapor reaction such that the layer at the corners is thicker than that on the flat surfaces due to the concentration of the electric field at the corners to thus render the corners more resistant to wear.

9. A method as in claim 8 where the thickness of the layer at the corners is approximately twice that of the layers at the flat surfaces.

10. A method as in claim 8 where said reactive gas comprises at least carbon and said layer comprises diamond or diamond like carbon.

11. A method as in claim 10 where said reactive gas includes an alcohol.

12. A method as in claim 8 where said reactive gas comprises boron and nitrogen and said layer comprises boron nitride.

13. A method as in claim 8 where said parts are parts of a watch.

* * * * *